United States Patent
Suh et al.

(10) Patent No.: US 9,865,775 B2
(45) Date of Patent: Jan. 9, 2018

(54) LIGHT EMITTING ELEMENT

(71) Applicant: SEOUL VIOSYS CO., LTD., Ansan-si (KR)

(72) Inventors: Duk Il Suh, Ansan-si (KR); Ye Seul Kim, Ansan-si (KR); Kyoung Wan Kim, Ansan-si (KR); Sang Won Woo, Ansan-si (KR); Ji Hye Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/394,333

(22) Filed: Dec. 29, 2016

(65) Prior Publication Data

US 2017/0110629 A1 Apr. 20, 2017

Related U.S. Application Data

(63) Continuation of application No. PCT/KR2015/006787, filed on Jul. 1, 2015.

(30) Foreign Application Priority Data

Jul. 1, 2014 (KR) .................. 10-2014-0082014
Jan. 23, 2015 (KR) .................. 10-2015-0011070
Jun. 26, 2015 (KR) .................. 10-2015-0091492

(51) Int. Cl.
*H01L 33/14* (2010.01)
*H01L 33/22* (2010.01)
(Continued)

(52) U.S. Cl.
CPC ............ *H01L 33/24* (2013.01); *H01L 33/145* (2013.01); *H01L 33/22* (2013.01); *H01L 33/38* (2013.01);
(Continued)

(58) Field of Classification Search
CPC ....... H01L 33/36; H01L 33/06; H01L 33/145; H01L 33/22; H01L 33/24; H01L 33/38; H01L 33/42; H01L 33/62
See application file for complete search history.

(56) References Cited

U.S. PATENT DOCUMENTS

2009/0159909 A1* 6/2009 Lee .................. H01L 33/38
257/96
2009/0283787 A1* 11/2009 Donofrio ............. H01L 33/405
257/98
(Continued)

FOREIGN PATENT DOCUMENTS

KR 1020070099269 A 10/2007
KR 1020100064050 A 6/2010
(Continued)

OTHER PUBLICATIONS

Korean Intellectual Property Office, International Search Report, International Patent Application No. PCT/KR2015/006787, dated Sep. 11, 2015, 2 pages.

*Primary Examiner* — Tom Thomas
*Assistant Examiner* — Benjamin Tzu-Hung Liu
(74) *Attorney, Agent, or Firm* — Perkins Coie LLP

(57) ABSTRACT

The light emitting element is provided to comprise: a first conductive type semiconductor layer; a mesa; a current blocking layer; a transparent electrode; a first electrode pad and a first electrode extension; a second electrode pad and a second electrode extension; and an insulation layer partially located on the lower portion of the first electrode, wherein the mesa includes at least one groove formed on a side thereof, the first conductive type semiconductor layer is partially exposed through the groove, the insulation layer includes an opening through which the exposed first conductive type semiconductor layer is at least partially exposed, the first electrode extension includes extension (Continued)

contact portions in contact with the first conductive type semiconductor layer through an opening, and the second electrode extension includes an end with a width different from the average width of the second electrode extension.

19 Claims, 12 Drawing Sheets

(51) Int. Cl.
    *H01L 33/24* (2010.01)
    *H01L 33/38* (2010.01)
    *H01L 33/42* (2010.01)
    *H01L 33/62* (2010.01)
(52) U.S. Cl.
    CPC .......... *H01L 33/382* (2013.01); *H01L 33/387* (2013.01); *H01L 33/42* (2013.01)

(56) References Cited

U.S. PATENT DOCUMENTS

| 2010/0140656 | A1* | 6/2010 | Kim | H01L 33/38 257/99 |
| 2011/0147784 | A1* | 6/2011 | Brockley | H01L 33/38 257/99 |
| 2013/0307007 | A1* | 11/2013 | Choi | H01L 33/405 257/98 |
| 2014/0151735 | A1 | 6/2014 | Donofrio et al. | |

FOREIGN PATENT DOCUMENTS

| KR | 1020120053571 A | | 5/2012 | |
| KR | 1020120140227 A | | 12/2012 | |
| WO | WO 2012067311 | * | 5/2012 | ............ H01L 33/36 |
| WO | WO 2012173416 | * | 12/2012 | ............ H01L 33/20 |

* cited by examiner

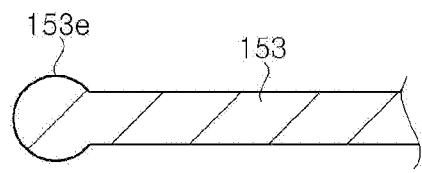
Fig. 9A
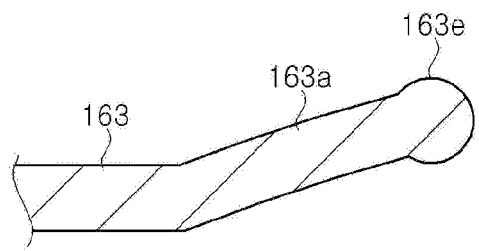
Fig. 9B
FIG. 10
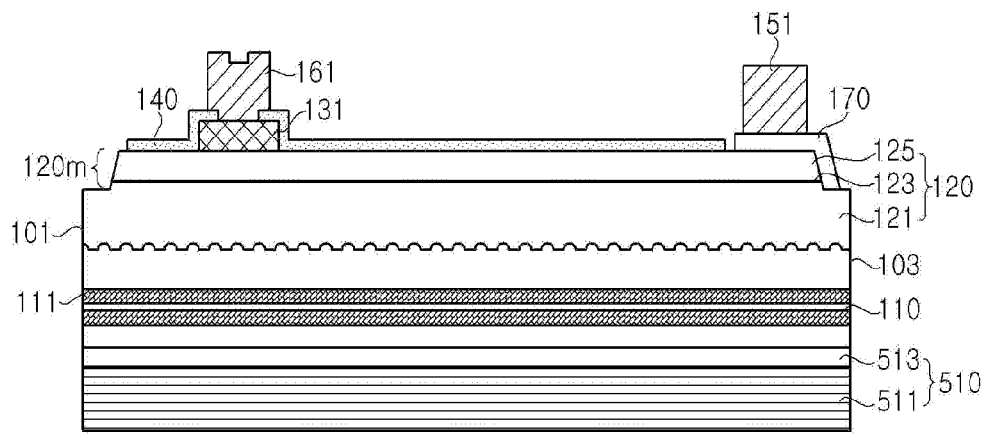

LIGHT EMITTING ELEMENT

CROSS-REFERENCES TO RELATED APPLICATIONS

This patent document is a continuation application of and claims priorities to, and benefits of International Patent Application No. PCT/KR2015/006787, filed on Jul. 1, 2015, Korean Patent Application No. 10-2015-0091492, filed on Jun. 26, 2015, Korean Patent Application No. 10-2015-0011070, filed on Jan. 23, 2015, and Korean Patent Application No. 10-2014-0082014, filed on Jul. 1, 2014, which are hereby incorporated by reference for all purposes as if fully set forth herein.

BACKGROUND

Exemplary embodiments described in this document relate to a light emitting device. For example, some embodiments of the present document relate to a light emitting device that has high current spreading efficiency to provide good properties in terms of luminous efficacy and reliability.

Generally, a light emitting device such as a light emitting diode includes an n-type semiconductor layer supplying electrons, a p-type semiconductor layer supplying holes, and an active layer interposed between the n-type semiconductor layer and the p-type semiconductor layer. An n-type and a p-type electrode are formed on the n-type semiconductor layer and the p-type semiconductor layer, respectively, to receive electric power from an external power source.

On the other hand, a nitride semiconductor-based p-type semiconductor layer has lower electrical conductivity than the n-type semiconductor layer. As a result, electric current is not efficiently spread in the p-type semiconductor layer, thereby causing current crowding in a certain region of the semiconductor layer. When current crowding occurs in the semiconductor layer, a light emitting diode becomes vulnerable to electrostatic discharge and can suffer from current leakage and efficiency droop. In order to achieve efficient current spreading, a transparent electrode such as an indium tin oxide (ITO) electrode is formed on the p-type semiconductor layer and the p-type electrode is formed on the ITO layer.

SUMMARY

Exemplary embodiments disclosed in the present document provide a light emitting device configured to achieve uniform current spreading in a horizontal direction.

Exemplary embodiments disclosed in the present document provide a light emitting device that includes a second electrode, a transparent electrode and a current blocking layer correlatively connected to one another to improve structural and electrical reliability.

Exemplary embodiments disclosed in the present document provide a light emitting device having improved bondability of wire bonding.

In accordance with one aspect, a light emitting device includes: a first conductive type semiconductor layer; a mesa disposed on the first conductive type semiconductor layer and including an active layer and a second conductive type semiconductor layer disposed on the active layer; a current blocking layer partially disposed on the mesa; a transparent electrode disposed on the mesa and at least partially covering the current blocking layer; a first electrode insulated from the second conductive type semiconductor layer, and including a first electrode pad and a first electrode extension portion extending from the first electrode pad; a second electrode disposed on the current blocking layer to be electrically connected to the transparent electrode, and including a second electrode pad and a second electrode extension portion extending from the second electrode pad; and an insulation layer partially disposed in a region under the first electrode, wherein the mesa includes at least one groove formed on a side surface thereof such that the first conductive type semiconductor layer is partially exposed through the groove; the insulation layer includes an opening at least partially exposing the exposed first conductive type semiconductor layer; the first electrode extension portion includes at least one extension contact portion contacting the first conductive type semiconductor layer through the opening; and the second electrode extension portion includes a distal end having a different width than an average width of the second electrode extension portion.

In some implementations, the width of the distal end of the second electrode extension portion may be greater than the average width of the second electrode extension portion.

In some implementations, the distal end of the second electrode extension portion may have a circular shape, a diameter of which is greater than a width of the second electrode extension portion.

In some implementations, the second electrode extension portion may include an additional extension portion bent from an extension direction of the second electrode extension portion, and the additional extension portion may be bent away from the first electrode extension portion.

In some implementations, the additional extension portion may be formed in a curved shape having a predetermined curvature.

In some implementations, the additional extension portion may be bent towards one corner of the light emitting device.

In some implementations, the first electrode pad and the second electrode pad may be disposed on a longitudinal line passing through a center of the light emitting structure; the first electrode pad may be disposed adjacent to a first side surface of the light emitting device; and the second electrode pad may be disposed adjacent to a third side surface of the light emitting device opposite the first side surface thereof.

In some implementations, the first electrode extension portion may extend towards the first side surface along a second side surface of the light emitting device disposed between the first side surface and the third side surface thereof; and the second electrode extension portion may be disposed closer to a fourth side surface of the light emitting device opposite the second side surface thereof than the second side surface thereof and may extend towards the third side surface thereof.

In some implementations, the shortest distance from the second electrode pad to the fourth side surface of the light emitting device may be the same as the shortest distance from the distal end of the second electrode extension portion to the fourth side surface thereof.

In some implementations, the opening of the insulation layer may include a plurality of openings arranged at constant intervals along the second side surface and the openings.

In some implementations, the shortest distance from the first electrode extension portion to the second electrode extension portion may be greater than a distance from the distal end of the second electrode extension portion to the first electrode pad.

In some implementations, a distance between the openings of the insulation layer may be three or more times a width of the opening of the insulation layers exposing the groove.

In some implementations, the current blocking layer may include a pad-current blocking layer disposed under the second electrode pad and an extension portion-current blocking layer disposed under the second electrode extension portion.

In some implementations, the transparent electrode may include a first opening disposed on the pad-current blocking layer; the second electrode pad may be disposed on the pad-current blocking layer to fill the first opening while partially covering the transparent electrode disposed on the pad-current blocking layer; and an upper surface of the second electrode pad may have a surface profile corresponding to an upper surface of the pad-current blocking layer and an upper surface of the transparent electrode disposed on the current blocking layer.

In some implementations, the pad-current blocking layer may include a second opening exposing the second conductive type semiconductor layer; the second electrode may contact the second conductive type semiconductor layer through the second opening; the second opening may be disposed in a region of the first opening; and an upper surface of the second electrode may include a first depression disposed corresponding to the first opening and a second depression disposed corresponding to the second opening.

In some implementations, the pad-current blocking layer may include a first region surrounded by the second opening and a second region surrounding the second opening; and an upper surface of the second electrode may include a protrusion protruding from a lower surface of the second depression and disposed in the first region of the pad-current blocking layer.

In some implementations, the insulation layer may be disposed on the mesa; the mesa may include at least one groove formed on a side surface thereof such that the first conductive type semiconductor layer is partially exposed through the groove; and the opening of the insulation layer may at least partially expose the first conductive type semiconductor layer exposed through the groove.

In some implementations, the first electrode pad and the first electrode extension portion may be disposed on the mesa and the extension portion-contact portion may form ohmic contact with the first conductive type semiconductor layer exposed through the groove.

In some implementations, the insulation layer may be disposed on the first conductive type semiconductor layer, and the extension portion-contact portion may include a first extension portion-contact portion and a second extension portion-contact portion, wherein the first extension portion-contact portion may be disposed along one side surface of the mesa and the second extension portion-contact portion may be disposed near one corner of the mesa so as to be adjacent to the first electrode pad.

In some implementations, the substrate may include a plurality of modification regions formed on at least one side surface thereof and having a strap shape extending in a horizontal direction thereof, and a distance between a lowermost modification region and a lower surface of the substrate may be smaller than a distance between an uppermost modification region and an upper surface of the substrate.

According to the exemplary embodiments, the light emitting device includes a first electrode pad disposed in a central region of a light emitting structure in the longitudinal direction of the light emitting structure, thereby improving efficiency of an electrode formation process, a packaging process, and the like.

According to the exemplary embodiments, the light emitting device includes a first electrode extension portion that contacts the first conductive type semiconductor layer through a contact point, thereby minimizing lateral light loss while improving current spreading efficiency.

In the light emitting device according to the exemplary embodiments, a second electrode extension portion has an additional extension portion formed in a curved shape, and thus can be formed as long as possible while maintaining a distance between the second electrode extension portion and a first electrode pad, thereby preventing current crowding at a distal end of the second electrode extension portion.

In the light emitting device according to the exemplary embodiments, a second electrode pad is disposed on a transparent electrode having an opening, and a portion of the transparent electrode is interposed between the current blocking layer and the second electrode pad, thereby improving structural and electrical reliability of a second electrode.

According to some implementations disclosed in this patent document, the light emitting device has improved wire bonding ability of bonding upon wire bonding to the second electrode of the light emitting device, thereby providing a light emitting device package having good reliability.

BRIEF DESCRIPTION OF THE DRAWINGS

FIGS. 9A and 9B are plan views of various modifications of a first electrode extension portion and a second electrode extension portion of the light emitting device according to the exemplary embodiment of the present disclosure.

FIG. 10 is a sectional view of a light emitting device according to other exemplary embodiments of the present disclosure.

DETAILED DESCRIPTION OF INVENTION

Figure 1A:
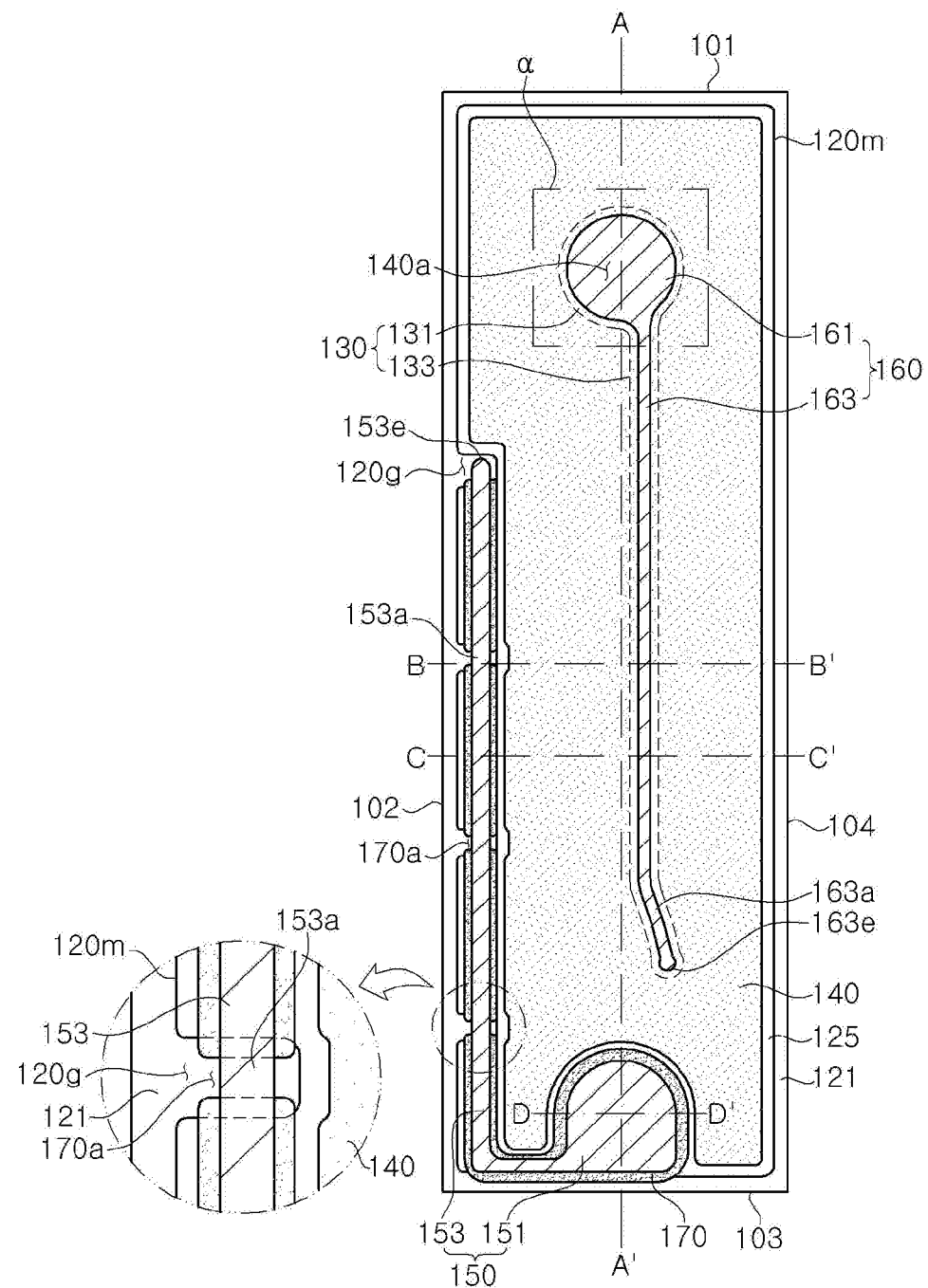
FIG. 1A and FIG. 1B are plan views of a light emitting device according to one exemplary embodiment of the present disclosure.

Hereinafter, exemplary embodiments will be described in detail with reference to the accompanying drawings. The following embodiments are provided by way of example so as to facilitate the understanding of the disclosed technology. Accordingly, the present disclosure is not limited to the embodiments disclosed herein and can also be implemented in different forms. When an element is referred to as being "disposed above" or "disposed on" another element, it can be directly "disposed above" or "disposed on" the other element, or intervening elements can be present. Throughout the specification, like reference numerals denote like elements having the same or similar functions. The term "exemplary" is used to mean "an example of" and does not necessarily mean an ideal or a best implementation.

Hereinafter, a light emitting device according to exemplary embodiments of the present disclosure will be described with reference to FIG. 1 (a) to FIG. 9.

Figure 1B:
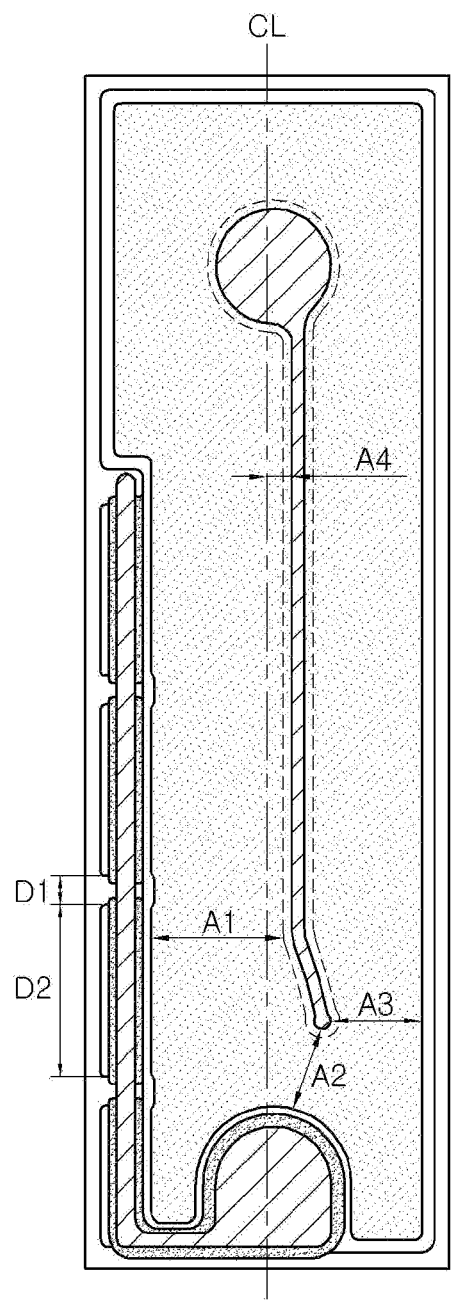
Figure 2A:
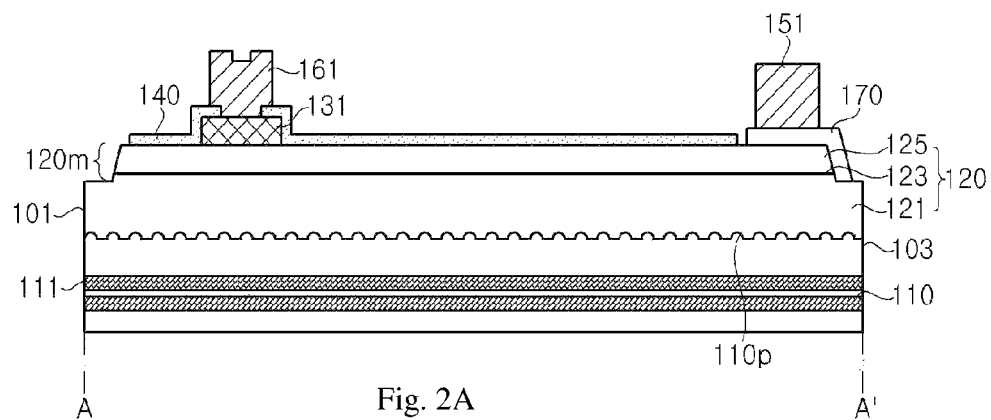
FIGS. 2A to 2C are sectional views of the light emitting device according to the exemplary embodiment of the present disclosure.
Figure 2B:
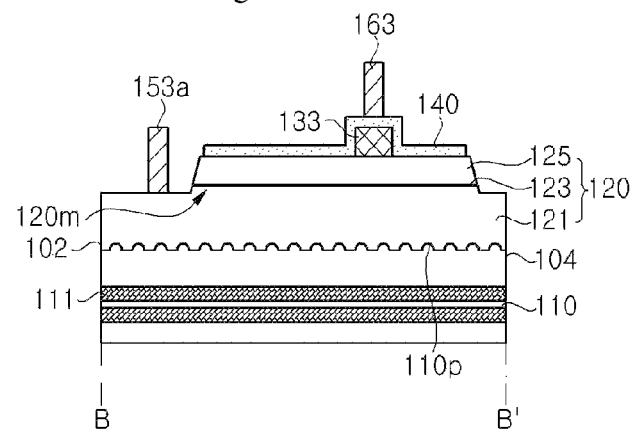
Figure 2C:
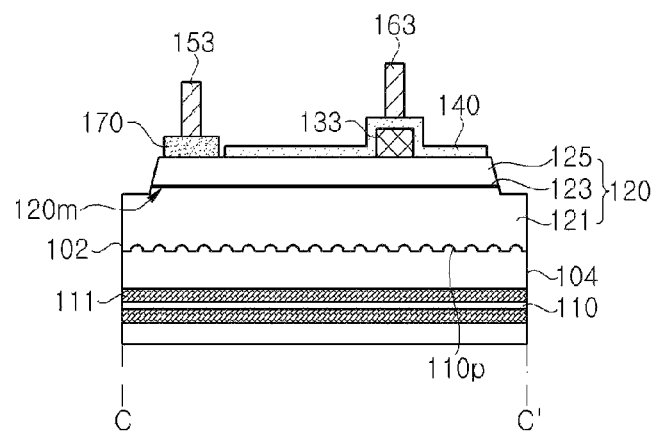
Figure 3A:
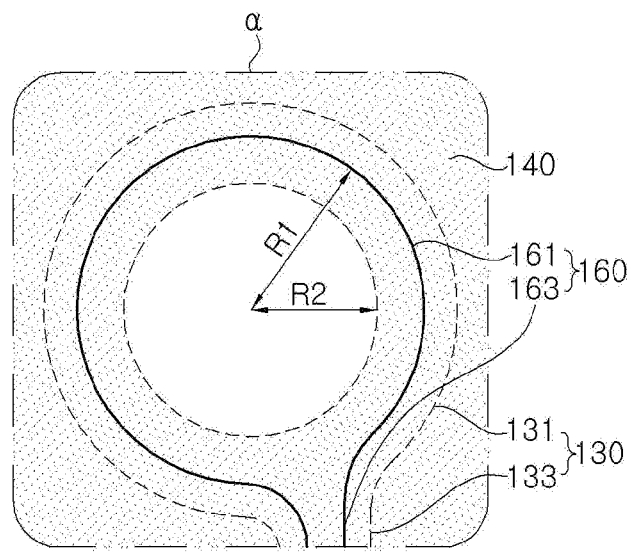
FIG. 3A to FIG. 6B are enlarged plan views and enlarged sectional views of various modifications of a second electrode, a current blocking layer and a transparent electrode of the light emitting device according to the exemplary embodiment of the present disclosure.
Figure 3B:
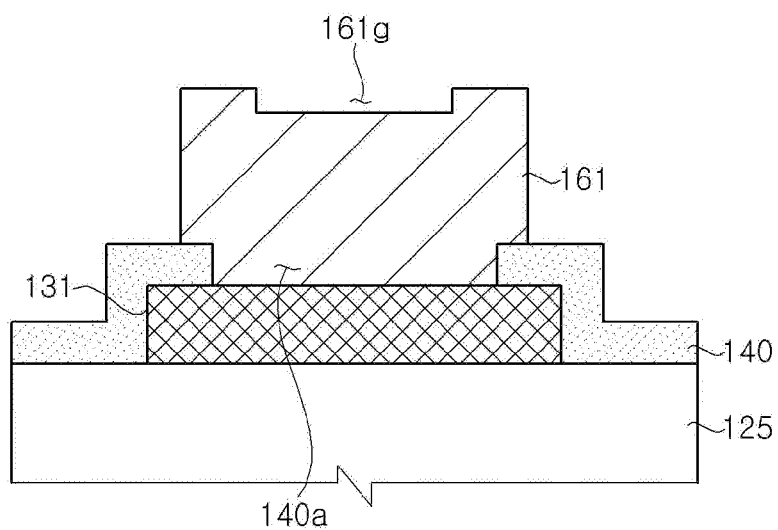
Figure 7:
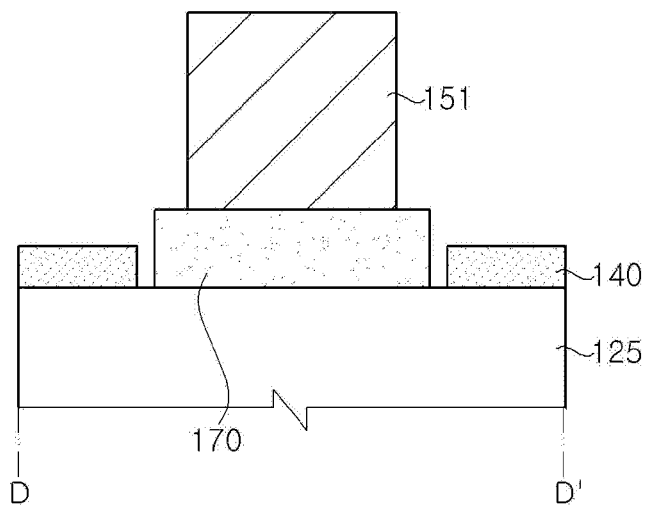
FIG. 7 and FIG. 8 are enlarged plan views of various modifications of a first electrode, a transparent electrode, and an insulation layer of the light emitting device according to the exemplary embodiment of the present disclosure.
Figure 8:
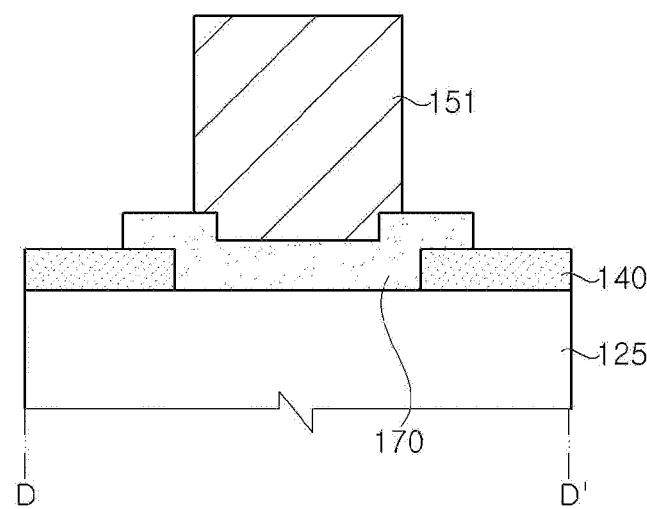

FIG. 1A and FIG. 1B are plan views of a light emitting device according to one exemplary embodiment of the present disclosure, in which FIG. 1A shows locations of an enlarged region (α), Line A-A', Line B-B', Line C-C' and Line D-D', and FIG. 1B shows widths or distances (A1, A2, A3, A4, D1 and D2) between components. FIGS. 2A to 2C are sectional views taken along Lines A-A', B-B' and C-C' of FIG. 1A, respectively. FIGS. 3A and 3B show an enlarged plan view and an enlarged sectional view of a second electrode of the light emitting device according to the exemplary embodiment of the present disclosure, and FIG. 4A to FIG. 6B are enlarged plan views and enlarged sectional views of various modifications of the second electrode of the light emitting device according to the exemplary embodiment of the present disclosure. FIG. 7 is a sectional view of a first electrode of the light emitting device according to the exemplary embodiment of the present disclosure, and FIG. 8 is a sectional view of a modification of the first electrode of the light emitting device according to the exemplary embodiment of the present disclosure. FIGS. 9A and 9B are plan views of a first electrode extension portion and a second electrode extension portion of the light emitting device according to the exemplary embodiment of the present disclosure.

Referring to FIG. 1A to FIG. 9B, the light emitting device includes a light emitting structure 120, a current blocking layer 130, a transparent electrode 140, a first electrode 150, and a second electrode 160. The light emitting device may further include a substrate 110 and an insulation layer 170. Further, the light emitting device may include first to fourth side surfaces 101, 102, 103, 104. The light emitting device may have a rectangular shape having different longitudinal and transversal lengths, without being limited thereto.

The substrate 110 may be or include an insulation or conductive substrate. In addition, the substrate 110 may be or include a growth substrate for growth of the light emitting structure 120, and may include a sapphire substrate, a silicon carbide substrate, a silicon substrate, a gallium nitride substrate, an aluminum nitride substrate, or the like. In other exemplary embodiments, the substrate 110 may be or include a secondary substrate for supporting the light emitting structure 120. For example, the substrate 110 may be or include a sapphire substrate, for example, a patterned sapphire substrate (PSS), an upper surface of which has a predetermined pattern, and, in this case, the substrate 110 may include a plurality of protrusions 110p on the upper surface thereof.

Further, the substrate 110 may include at least one modification region 111 extending from at least one side surface of the substrate 110 in the horizontal direction thereof. The modification regions 111 may be formed in the course of dividing the substrate 110 in order to individualize light emitting devices. For example, the modification regions 111 may be formed by internal processing of the substrate 110 using a stealth laser. Here, a distance from a lowermost modification region 111 to a lower surface of the substrate 110 may be smaller than an uppermost modification region 111 to an upper surface of the substrate 110. Considering light emitted through the side surfaces of the light emitting device, the modification region 111 may be formed at a relatively lower portion of the substrate 110 by laser processing, thereby further improving extraction efficiency of light generated in the light emitting structure 120.

In this exemplary embodiment, a first conductive type semiconductor layer 121 will be illustrated as being disposed on the substrate 110. However, when the substrate 110 is a growth substrate for growth of semiconductor layers 121, 123, 125, the substrate 100 may be removed through a physical and/or chemical process after growth of the semiconductor layers 121, 123, 125.

The light emitting structure 120 may include the first conductive type semiconductor layer 121, a second conductive type semiconductor layer 125 disposed on the first conductive type semiconductor layer 121, and an active layer 123 disposed between the first conductive type semiconductor layer 121 and the second conductive type semiconductor layer 125. Further, the light emitting structure 120 may include a mesa 120m disposed on the first conductive type semiconductor layer 121 and including the active layer 123 and the second conductive type semiconductor layer 125.

The first conductive type semiconductor layer 121, the active layer 123 and the second conductive type semiconductor layer 125 may be grown in a chamber by a typical method known in the art, such as MOCVD. In addition, the first conductive type semiconductor layer 121, the active layer 123 and the second conductive type semiconductor layer 125 may include a III-V nitride semiconductor material, for example, a nitride semiconductor material such as (Al, Ga, In)N. The first conductive type semiconductor layer 121 may include n-type dopants (for example, Si, Ge, and Sn), and the second conductive type semiconductor layer 125 may include p-type dopants (for example, Mg, Sr, and Ba), or vice versa. The active layer 123 may include a multi-quantum well (MQW) structure, and the composition ratio of the active layer may be regulated to light in a desired wavelength band. As an example, in this exemplary embodiment, the second conductive type semiconductor layer 125 may be a p-type semiconductor layer.

The mesa 120m is placed in some region of the first conductive type semiconductor layer 121 such that the first conductive type semiconductor layer 121 can be exposed in a region in which the mesa 120m is not formed. The mesa 120m may be formed by partially etching the second conductive type semiconductor layer 125 and the active layer 123. Although the mesa 120m may have any shape without limitation, for example, the mesa 120m may be formed along a side surface of the first conductive type semiconductor layer 121, as shown in the drawings. The mesa 120m may have an inclined side surface or a side surface perpendicular to an upper surface of the first conductive type semiconductor layer 121. In this exemplary embodiment, the mesa 120m may include at least one groove 120g formed or depressed on the side surface thereof. The grooves 120g may be formed along at least one side surface of the light emitting device. For example, a plurality of grooves 120g may be formed along the second side surface 102 of the light emitting device, as shown in FIG. 1A. The plurality of grooves 120g may be arranged at substantially constant intervals.

The mesa 120m may further include a roughness pattern (not shown) formed on the side surface thereof. In addition, the first conductive type semiconductor layer 121 and the substrate 110 may also further include roughness patterns (not shown) formed on side surfaces thereof. The roughness patterns may be formed by various patterning methods such as dry etching and/or wet etching. Further, the roughness patterns may be formed in an isolation process by which a wafer is divided into individual light emitting devices. With this structure, the light emitting device can have improved light extraction efficiency. It should be understood that other implementations are also possible. For the light emitting device having other structures (for example, a vertical structure) instead of the lateral structure, the upper surface of the first conductive type semiconductor layer 121 may not be exposed.

The current blocking layer 130 is at least partially disposed on the second conductive type semiconductor layer 125. The current blocking layer 130 may be disposed corresponding to the second electrode 160 on the second conductive type semiconductor layer 125. The current blocking layer 130 may include a pad-current blocking layer 131 and an extension portion-current blocking layer 133. The pad-current blocking layer 131 and the extension portion-current blocking layer 133 may be disposed corresponding to a second electrode pad 161 and a second electrode extension portion 163, respectively. In this structure, the pad-current blocking layer 131 may be disposed adjacent to the first side surface 101 of the light emitting device and the extension portion-current blocking layer 133 may be disposed to extend from the first side surface 101 towards the third side surface 103, as shown in the drawings.

The current blocking layer 130 can prevent current crowding caused by direct transfer of electric current supplied from the second electrode 160 to the semiconductor layers. Thus, the current blocking layer 130 may exhibit insulation properties and may include an insulation material and be composed of or include a single layer or multiple layers. For example, the current blocking layer 130 may include $SiO_x$ or $SiN_x$, or may include a distributed Bragg reflector in which insulation materials having different indices of refraction are stacked one above another. The current blocking layer 130 may have light transmittance or light reflectivity, or may have selective light reflectivity.

In some implementation, the current blocking layer 130 may have a larger area than the second electrode 160 formed on the current blocking layer 130. With this structure, the second electrode 160 may be disposed in a region in which the current blocking layer 130 is formed. Furthermore, the current blocking layer 130 may have an inclined side surface, whereby the risk of peeling or electrically opening the transparent electrode 140 at a corner (that is, an angled portion) of the current blocking layer 130 can be reduced.

The transparent electrode 140 may be disposed on the second conductive type semiconductor layer 125 and covers a portion of an upper surface of the second conductive type semiconductor layer 125 and a portion of the current blocking layer 130. The transparent electrode 140 may include an opening 140a partially exposing the pad-current blocking layer 131. The opening 140a may be disposed on the pad-current blocking layer 131 and the transparent electrode 140 may partially cover the pad-current blocking layer 131. Furthermore, a side surface of the opening 140a may be generally formed along a side surface of the pad-current blocking layer 131.

The transparent electrode 140 may include a light transmittable and electrically conductive material such as a conductive oxide or light transmittable metal layer. For example, the transparent electrode 140 may include at least one of ITO (indium tin oxide), ZnO (zinc oxide), ZITO (zinc indium tin oxide), ZIO (zinc indium oxide), ZTO (zinc tin oxide), GITO (gallium indium tin oxide), GIO (gallium indium oxide), GZO (gallium zinc oxide), AZO (aluminum-doped zinc oxide), FTO (fluorine tin oxide), or a Ni/Au stack structure. In addition, the transparent electrode 140 may form ohmic contact with the second conductive type semiconductor layer 125. In this exemplary embodiment, since the second electrode 160 does not directly contact the second conductive type semiconductor layer 125, electric current can be more effectively spread through the transparent electrode 140. The transparent electrode 140 will be described below in more detail with reference to FIGS. 3A and 3B.

The transparent electrode 140 may include a depression formed around the groove 120g of the mesa 120m. As shown in an enlarged circle of FIG. 1A, the depression of the transparent electrode 140 may be formed along the groove 120g of the mesa 120m. With the structure wherein the transparent electrode 140 includes the depression, an edge line of the transparent electrode 140 may also be formed along an edge line of the mesa 120m. With the structure wherein the depression is formed on the transparent electrode 140, it is possible to prevent electric short due to formation of the transparent electrode 140 on a side surface of the groove 120g in fabrication of the light emitting device. In some implementations, as shown in FIGS. 2A to 2C, the transparent electrode 140 covers less than an entire surface of the mesa 120m. However, other implementations are also possible where the transparent electrode 140 covers the entire surface of the mesa 120m.

The second electrode 160 is disposed on the second conductive type semiconductor layer 125 such that at least part of the second electrode 160 is disposed in a region in which the current blocking layer 130 is placed. The second electrode 160 may include a second electrode pad 161 and a second electrode extension portion 163, which may be disposed on the pad-current blocking layer 131 and the extension portion-current blocking layer 133, respectively. Thus, part of the transparent electrode 140 may be interposed between the second electrode 160 and the current blocking layer 130. The second electrode pad 161 may be disposed on the opening 140a of the transparent electrode 140. The second electrode pad 161 may adjoin the transparent electrode 140 and the side surface of the opening 140a of the transparent electrode 140 may at least partially adjoin the second electrode pad 161. The second electrode pad 161 may be disposed so as to allow light emission through an overall surface of the active layer of the light emitting device by efficiently spreading electric current, without being limited thereto. For example, as shown in the drawings, the second electrode pad 161 may be disposed adjacent to the first side surface 101 opposite to the third surface 103 to which the first electrode pad 151 is adjacent.

The second electrode extension portion 163 extends from the second electrode pad 161. In this exemplary embodiment, the second electrode extension portion 163 may extend from the second electrode pad 161 towards the third side surface 103. Further, the extension direction of the second electrode extension portion 163 may be changed along the extension of the second electrode extension portion 163. For example, a distal end of the second electrode extension portion 163 may be bent so as to be directed to a space formed between the third side surface 103 and the fourth side surface 104 of the light emitting device. This structure may be designed in various ways by taking the distance between the first electrode pad 151 and the second electrode extension portion 163 into account. The transparent electrode 140 is interposed between at least part of the second electrode extension portion 163 and the extension portion-current blocking layer 133, whereby the second electrode extension portion 163 contacts the transparent electrode 140 to be electrically connected thereto.

Further, the second electrode extension portion 163 may include an additional extension portion 163a bent or curved in a different direction from the extension direction of the second electrode extension portion 163. Here, the additional extension portion 163a may be bent to be further away from the first electrode extension portion 153. Furthermore, the additional extension portion 163a may be bent towards one corner of the light emitting device, for example, towards a corner between the third side surface 103 and the fourth side surface 104. As shown in FIG. 1A, the additional extension portion 163a of the second electrode extension portion 163 may have a curved shape having a predetermined radius of curvature. Although a longer length of the second electrode extension portion 163 can provide further improved current spreading efficiency, an excessively short distance from the distal end 163e of the second electrode extension portion 163 to the first electrode pad 151 can cause current crowding at the distal end 163e of the second electrode extension portion 163. According to this exemplary embodiment, the second electrode extension portion 163 is bent and the additional extension portion 163a is formed in a curved shape having a predetermined radius of curvature, whereby the distance between the second electrode extension portion 163 and the first electrode pad 151 can be maintained at a predetermined value or more. With this structure, the light emitting device can prevent current crowding at the distal end 163e of the second electrode extension portion 163.

Further, the distal end 163e of the second electrode extension portion 163 may include a portion, the width of which is greater than an average width of the second electrode extension portion 163. For example, as shown in FIG. 9B, the distal end 163e of the second electrode extension portion 163 may be formed in a circular shape, the diameter of which is greater than the width of the second electrode extension portion 163. In this embodiment, the diameter of the distal end 163e may be greater than the width of the second electrode extension portion 163 by about 0.5 μm to 5 μm. However, it should be understood that other implementations are also possible and that the shape of the distal end 163e of the second electrode extension portion 163 may be modified in various shapes including a polygonal shape, an oval shape, or a circular arc shape, and the like.

With the structure wherein the distal end 163e of the second electrode extension portion 163 has a relatively large width, it is possible to improve current spreading around the distal end 163e of the second electrode extension portion 163. Further, the distal end 163e of the second electrode extension portion 163 has an enlarged area, thereby effectively preventing failure of the light emitting device due to separation of the second electrode extension portion 163 from the transparent electrode 140 at the distal end 163e of the second electrode extension portion 163 while preventing increase in contact resistance at the distal end 163e of the second electrode extension portion 163. Since the second electrode 160 is generally formed through photolithography, there has been a problem in that development can be inefficiently performed around the distal end 163e of the second electrode 160. However, in the structure wherein the distal end 163e of the second electrode extension portion 163 has a relatively large area, a process margin can be further provided upon photolithography, thereby preventing failure in the process of forming the second electrode 160. As a result, the light emitting device can have further improved reliability.

The arrangement of the second electrode 160 is not limited thereto and may be modified and changed in various ways depending upon the shape of the light emitting device.

The second electrode 160 may include a metallic material, for example, Ti, Pt, Au, Cr, Ni, or Al, and the like, and may be composed of a single layer or multiple layers. For example, the second electrode 160 may include at least one of metal stack structures of Ti/Au layers, Ti/Pt/Au layers, Cr/Au layers, Cr/Pt/Au layers, Ni/Au layers, Ni/Pt/Au layers, or Cr/Al/Cr/Ni/Au layers.

Next, referring to FIGS. 3A and 3B, an interconnection relationship among the pad-current blocking layer 131, the transparent electrode 140 and the second electrode pad 161 will be described in more detail.

As shown in FIGS. 3A and 3B, the pad-current blocking layer 131 may generally have a circular shape in a plan view. Alternatively, the pad-current blocking layer 131 may be formed in various shapes including a polygonal shape and may be formed in a similar shape corresponding to the second electrode pad 161 in a plan view. The transparent electrode 140 may cover a side surface of the pad-current blocking layer 131 and a portion of an upper surface thereof, for example, around an outer periphery of the pad-current blocking layer 131. In the structure wherein the transparent electrode 140 partially covers the pad-current blocking layer 131, a surface profile including an upper surface of the transparent electrode 140 and an upper surface of the pad-current blocking layer 131 may become a rounded or stepped profile instead of a flat profile.

At least part of the opening 140a of the transparent electrode 140 may be disposed on the pad-current blocking layer 131, and in this exemplary embodiment, the shape of the opening 140a may correspond to a shape of an outer periphery of the current blocking layer 130. For example, as shown in FIGS. 3A and 3B, in a structure wherein the pad-current blocking layer 131 has a circular shape, the transparent electrode 140 covers a region around the circular periphery thereof such that the opening 140a can be formed in a circular shape. The opening 140a is formed in a shape corresponding to the shape of the outer periphery of the pad-current blocking layer 131, thereby preventing the transparent electrode 140 from peeling off the current blocking layer 130. It should be understood that the opening 140a is not limited thereto and may have various shape. In addition, the opening 140a may be provided in plural.

Contact resistance between the second electrode pad 161 and the second conductive type semiconductor layer 125 is higher than contact resistance between the transparent electrode 140 and the second conductive type semiconductor layer 125. Thus, when electric current is supplied through the second electrode pad 161, the electric current is likely to flow to the transparent electrode 140 having low resistance and can be effectively spread by the transparent electrode 140 in the horizontal direction. Furthermore, in this exemplary embodiment, the second electrode pad 161 does not directly contact the second conductive type semiconductor layer 125, thereby enabling more effective current spreading.

The second electrode 160 may fill the opening 140a to contact the current blocking layer 130 and may further partially cover the transparent electrode 140 disposed on the current blocking layer 130. Accordingly, the second electrode 160, particularly, the second electrode pad 161 contacts the transparent electrode 140. Here, a horizontal area of the second electrode pad 161 may be larger than the area of the opening 140a of the transparent electrode 140, whereby the opening 140a can be covered by the second electrode pad 161. As shown in FIGS. 3A and 3B, the second electrode pad 161 may be formed in a circular shape having a radius R1 and the opening 140a of the transparent electrode 140 may be formed in a circular shape having a radius R2. R1 is larger than R2. The sizes of R1 and R2 may be adjusted to provide a region for sufficient wire bonding and to prevent separation of the second electrode pad 161 and the transparent electrode 140. R1 may be larger than R2 by about 5 μm to 15 μm. For example, the second electrode pad 161 may have a radius R1 of about 35 μm and the opening 140a of the transparent electrode 140 may have a radius R2 of about 25 μm. In some implementations, the difference between R1 and R3 is a little bit smaller than the difference between R1 and R2.

The second electrode pad 161 may be formed to have a non-planar upper surface. For example, the upper surface of the second electrode pad 161 may have a surface profile corresponding to the surface profile of the upper surface of the transparent electrode 140 and the upper surface of the pad-current blocking layer 131. That is, the second electrode pad 161 may be disposed on the transparent electrode 140 and the pad-current blocking layer 131, which have non-flat surface profiles, and thus have a rounded or stepped surface. As shown in FIGS. 3A and 3B, the upper surface of the second electrode pad 161 may include at least one depression 161g disposed in a region in which the opening 140a is placed. As a result, the upper surface of the second electrode pad 161 may have a stepped surface. In some implementations, the depression 161g may be formed in a circular shape as shown in FIG. 3A. Accordingly, in the structure wherein the second electrode pad 161 is formed in a circular shape, the outer periphery of the second electrode pad 161 and the periphery of the depression 161g may be formed in concentric circle shapes.

In the structure wherein the second electrode pad 161 has a non-flat surface profile, bondability between a wire and the second electrode pad 161 can be improved upon wire bonding the upper surface of the second electrode pad 161. With this structure, the light emitting device can effectively prevent disconnection of the wire in a region in which the wire is bonded to the second electrode pad 161. Further, the second electrode pad 161 is disposed on the transparent electrode 140 and the pad-current blocking layer 131, which have the non-flat surface profiles, thereby preventing the second electrode pad 161 from being peeled off the current blocking layer 130 and/or the transparent electrode 140. That is, since the second electrode pad 161 can be more stably disposed in the structure wherein the second electrode pad 161 is formed on a stepped or rounded surface than in the structure wherein the second electrode pad 161 is formed in a flat surface, the second electrode pad 161 is prevented from being peeled off therefrom. Furthermore, since a portion of the transparent electrode 140 is interposed between the pad-current blocking layer 131 and the second electrode pad 161, the transparent electrode 140 can be more stably disposed, thereby preventing separation of the transparent electrode 140. Accordingly, structural stability among the second electrode 160, the current blocking layer 130 and the transparent electrode 140 can be improved.

FIG. 4A to FIG. 6B are plan views and sectional views of a current blocking layer, a transparent electrode and a second electrode according to various exemplary embodiment of the present disclosure. In the following exemplary embodiments, reference numerals of components will be denoted with different hundreds digits. For example, in FIGS. 3A and 3B, the current blocking layer is denoted by 130, whereas in FIGS. 4A and 4B, the current blocking layer will be denoted by 230. This is provided for convenience of description and physical characteristics of each component are the same as those of the corresponding component described above.

Figure 4A:
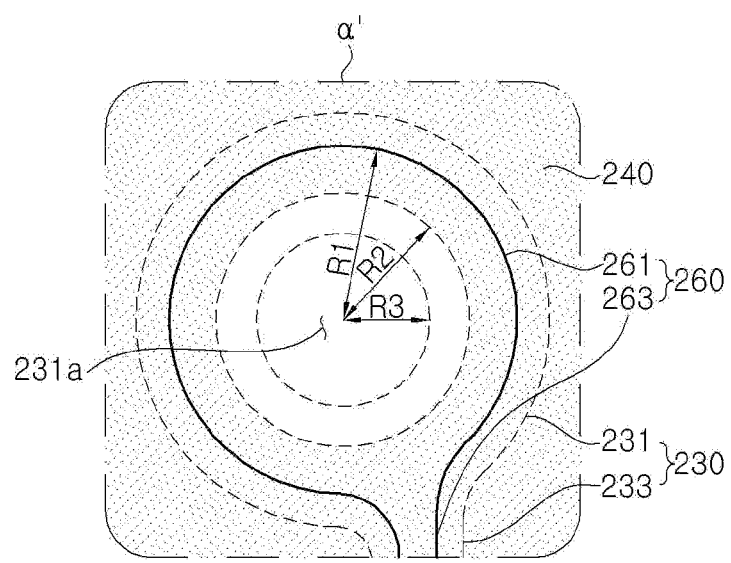
Figure 4B:
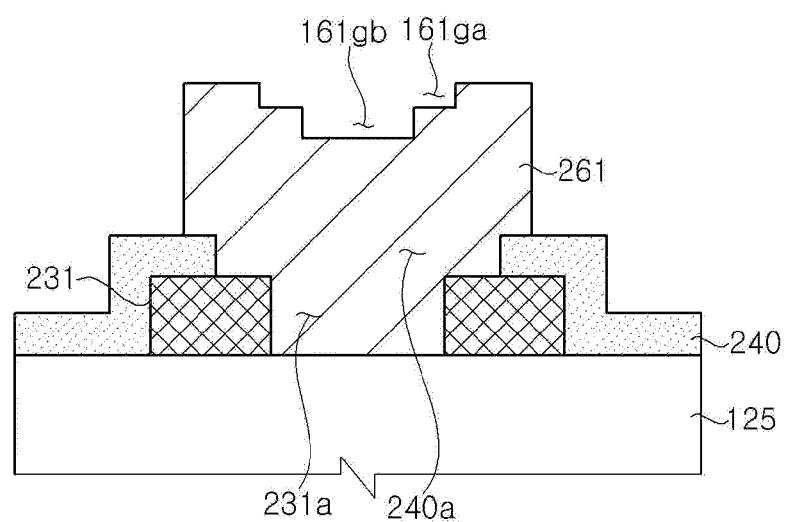

First, referring to FIGS. 4A and 4B, according to this exemplary embodiment, a transparent electrode 240 may include a first opening 240a and a pad-current blocking layer 231 may include a second opening 231a exposing the second conductive type semiconductor layer 125. Accordingly, a second electrode pad 261 contacts the second conductive type semiconductor layer 125 through the second opening 231a.

The second opening 231a may be disposed in a region in which the first opening 240a is placed, and the transparent electrode 240 may cover an outer peripheral region of the pad-current blocking layer 231. Accordingly, a stepped surface profile including an upper surface of the transparent electrode 240, an upper surface of the pad-current blocking layer 231, and an upper surface of the second conductive type semiconductor layer 125 under the second opening 231a is formed. Accordingly, the upper surface of the second electrode pad 261 may include a first depression 261ga disposed corresponding to the first opening 240a and a second depression 261gb disposed corresponding to the second opening 231a.

In this exemplary embodiment, a horizontal area of the second electrode pad 261 may be larger than the area of the first opening 240a of the transparent electrode 240 and a horizontal area of the first opening 240a may be larger than that of the second opening 231a. Accordingly, the openings 240a, 231a may be covered by the second electrode pad 261. As shown in FIGS. 4A and 4B, the second electrode pad 261 may be formed in a circular shape having a radius R1, the first opening 240a of the transparent electrode 240 may be formed in a circular shape having a radius R2, and the second opening 231a may be formed in a circular shape having a radius R3. Here, R1 is greater than R2, which is greater than R3. The sizes of R1 to R3 may be adjusted to provide a region for sufficient wire bonding and to prevent separation of the second electrode pad 261 and the transparent electrode 240.

As the pad-current blocking layer 231 includes the second opening 231a, more steps and curves are formed on the upper surface of the second electrode pad 261. With this structure, the second electrode pad 261 can be more stably disposed and allows a wire to be more stably bonded thereto upon wire bonding.

Figure 5A:
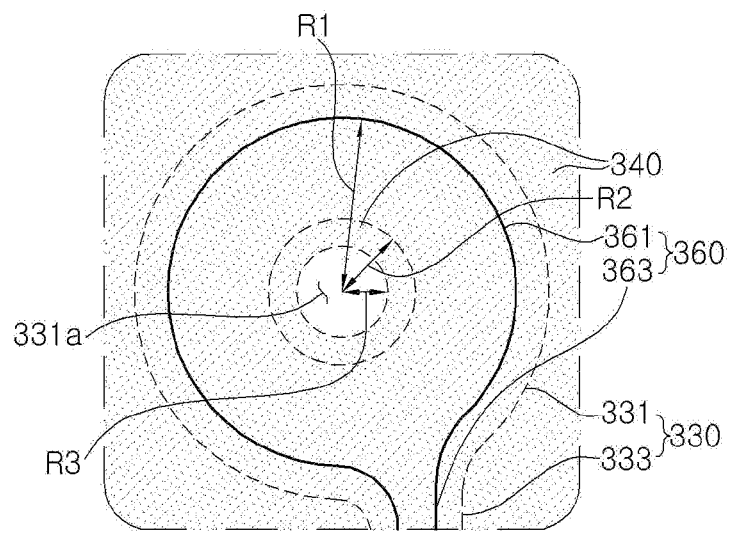
Figure 5B:
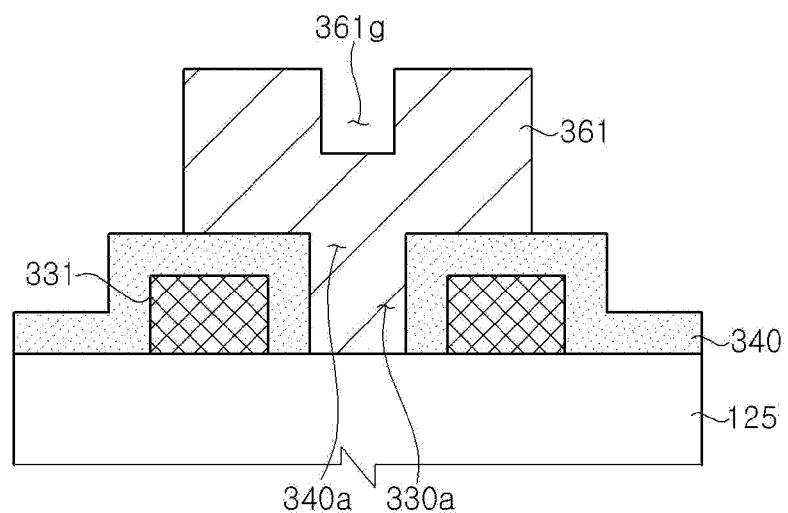

Next, referring to FIGS. 5A and 5B, in this exemplary embodiment, a transparent electrode 340 includes a first opening 340a and a pad-current blocking layer 331 may include a second opening 331a exposing the second conductive type semiconductor layer 125. Further, the transparent electrode 340 may cover the pad-current blocking layer 331. As shown in FIGS. 5A and 5B, the transparent electrode 340 may cover a side surface of the second opening 331a of the pad-current blocking layer 331. Accordingly, a second electrode pad 361 may contact the second conductive type semiconductor layer 125 through the second opening 331a and the first opening 340a.

An upper surface of the second electrode pad 361 may include a depression 361g disposed corresponding to the first opening 340a. According to this exemplary embodiment, the pad-current blocking layer 331 includes the second opening 331a while covered by the transparent electrode 340. Thus, the upper surface of the second electrode pad 361 may include a depression 361g, the depth of which is greater than the thickness of the pad-current blocking layer 331. In addition, the depression 361g of the second electrode pad 361 is deeper than the depression shown in FIGS. 3A and 3B.

Furthermore, as shown in FIGS. 5A and 5B, the second electrode pad 361 may be formed in a circular shape having a radius R1, the first opening 340a of the transparent electrode 340 may be formed in a circular shape having a radius R2, and the second opening 331a may be formed in a circular shape having a radius R3. Here, R1 is larger than R2, which is larger than R3. The sizes of R1 to R3 may be adjusted to provide a region for sufficient wire bonding and to prevent separation of the second electrode pad 361 and the transparent electrode 340.

Figure 6A:
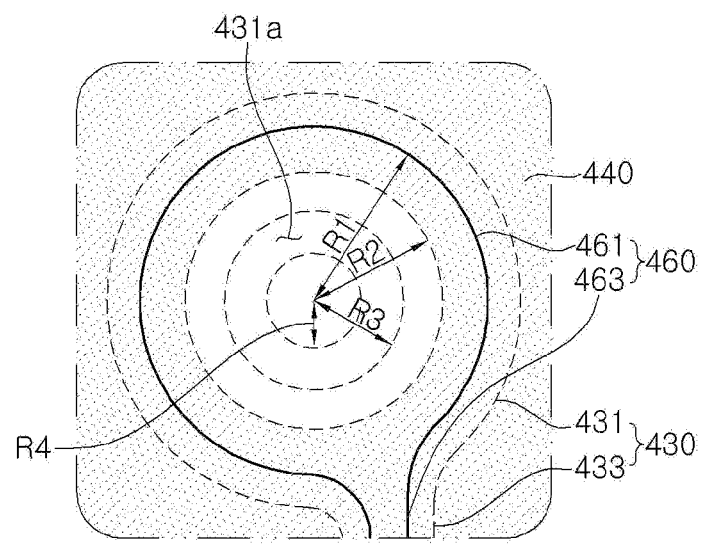
Figure 6B:
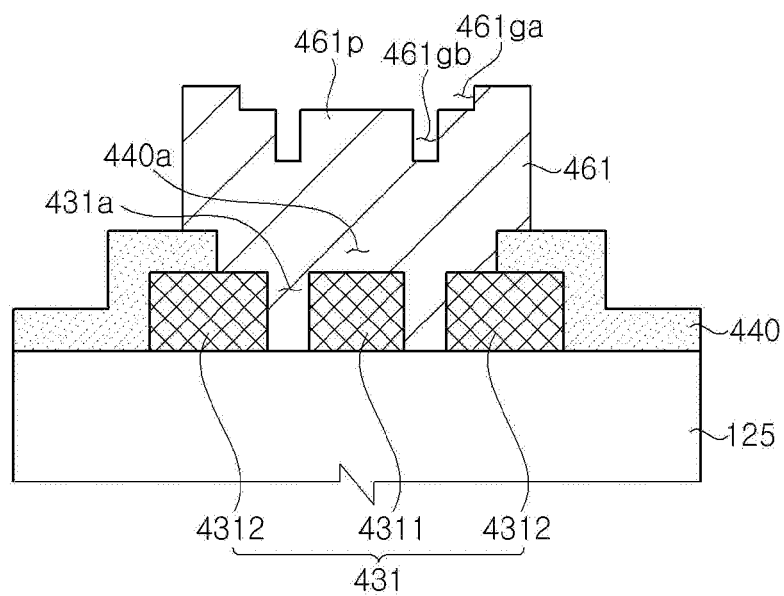

Referring to FIGS. 6A and 6B, a pad-current blocking layer 431 may include a second opening 431a exposing the second conductive type semiconductor layer 125, a first portion 4311 surrounded by the second opening 431a, and a second portion 4312 surrounding the second opening 431a. A transparent electrode 440 may partially cover an outer peripheral region of the second portion 4312 of the pad-current blocking layer 431. In this exemplary embodiment, an upper surface of the second portion 4312 is partially exposed. Accordingly, a surface profile, in which an upper surface of a transparent electrode 440, an upper surface of the second portion 4312 of the pad-current blocking layer 431, an upper surface of the second conductive type semiconductor layer 125 under the second opening 431a, and the upper surface of the first portion 4311 have steps, is formed. Accordingly, an upper surface of a second electrode pad 461 may include a first depression 461ga disposed corresponding to the first opening 440a, a second depression 461gb disposed corresponding to the second opening 431a, and a protrusion 461p disposed corresponding to the first portion 4311.

As the pad-current blocking layer 431 includes the first portion 4311 surrounded by the second opening 431a and the second opening 431a, more steps and curves are formed on the upper surface of the second electrode pad 461. With this structure, the second electrode pad 461 can be more stably disposed and allows a wire to be more stably bonded thereto upon wire bonding.

On the other hand, in the exemplary embodiments of FIG. 4A to FIG. 6B, each of the second electrodes 260, 360, 460 may contact the second conductive type semiconductor layer 125. Here, a lower surface of each of the second electrodes 260, 360, 460 may be formed such that poor ohmic contact is formed between each of the second electrodes 260, 360, 460 and the second conductive type semiconductor layer 125 and high contact resistance is formed at an interface therebetween. For example, each of the second electrodes 260, 360, 460 may be formed in a multilayer structure, the lowermost layer of which is formed of a material forming poor ohmic contact with the second conductive type semiconductor layer 125. Accordingly, upon application of electric current, the electric current flows to the transparent electrode 240, 340 or 440 having a relatively low resistance at an interface thereof, thereby preventing reduction in current spreading efficiency.

Although various structures of the second electrode, the transparent electrode, and the current blocking layer according to various exemplary embodiments have been described above, it should be understood that other implementations are also possible.

Referring to FIG. 1A to FIG. 3B again, the first electrode 150 is electrically connected to the first conductive type semiconductor layer 121. The first electrode 150 may form ohmic contact with and be electrically connected to the exposed upper surface of the first conductive type semiconductor layer 121, which is exposed by partially removing the second conductive type semiconductor layer 125 and the active layer 123. The first electrode 150 may include a first electrode pad 151 and a first electrode extension portion 153. The first electrode extension portion 153 includes at least one extension portion-contact portion 153a. The extension portion-contact portion 153a may form ohmic contact with the first conductive type semiconductor layer 121. In this exemplary embodiment, parts of the first electrode pad 151 and the first electrode extension portion 153 may be disposed on the mesa 120m, and the insulation layer 170 may be interposed between the mesa 120m and part of the first electrode 150.

The first electrode 150 can act as a path through which electric power is supplied from an external power source to the first conductive type semiconductor layer 121 and may include a metallic material such as Ti, Pt, Au, Cr, Ni, or Al, and the like. In addition, the first electrode 150 may be composed of a single layer or multiple layers.

The first electrode pad 151 may be disposed near the third side surface 103 of the light emitting device and the first electrode extension portion 153 may extend towards the first side surface 101 along the third side surface 103 and the second side surface 102. Generally, in a light emitting device having a rectangular shape, the first electrode pad is formed in a corner region of the light emitting device. However, in the structure wherein the first electrode pad is formed in the corner region of the light emitting device, part of a lead frame can be damaged upon ball bonding or wire bonding. Thus, as in this exemplary embodiment, the first electrode pad 151 is formed in a central region of the light emitting structure 120, thereby improving process efficiency in bonding and packaging.

Here, in order to improve process efficiency by securing a suitable level of process margin upon packaging, the first electrode pad 151 may be separated from the outer side surface of the light emitting structure 120 by at least 50 μm or more. However, if the first electrode pad 151 is excessively separated from the outer side surface of the light emitting structure 120, the light emitting device can suffer from deterioration in luminous efficacy in an outer peripheral region of the light emitting structure 120. Thus, the first electrode pad 151 is preferably separated from outer side surface of the light emitting structure 120 by about 50 μm to about 200 μm. However, it should be understood that other implementations are also possible.

The insulation layer 170 may be interposed between the light emitting structure 120 and the first electrode 150, and may include an opening 170a which partially exposes the first conductive type semiconductor layer 121 exposed through the groove 120g of the mesa 120m.

As shown in FIG. 1A, part of the insulation layer 170 is disposed under the first electrode pad 151 to electrically insulate the first electrode pad 151 from the second conductive type semiconductor layer 125. In addition, the insulation layer 170 disposed under the first electrode pad 151 may have a larger area than the first electrode pad 151 and may cover a side surface of the light emitting structure 120. With this structure, the light emitting device can effectively prevent occurrence of short circuit between the first electrode pad 151 and the second conductive type semiconductor layer 125 and short circuit which can occur upon wire bonding to the first electrode pad 151.

In one exemplary embodiment, as shown in FIG. 7, the insulation layer 170 disposed under the first electrode pad 151 may be separated from the transparent electrode 140. In this case, current leakage caused by defects in the insulation layer 170 can be prevented from flowing to the transparent electrode 140. In other exemplary embodiments, as shown in FIG. 8, the insulation layer 170 disposed under the first electrode pad 151 may adjoin the transparent electrode 140 while partially covering the side surface and the upper surface of the transparent electrode 140. With this structure, it is possible to prevent short circuit that can occur when a bonding material flows along the side surface of the first electrode pad 151 and contacts the transparent electrode 140 upon bonding to the upper surface of the first electrode pad 151.

The opening 170a of the insulation layer 170 can at least partially expose the groove 120g. The extension portion-contact portion 153a is disposed in a region of the first conductive type semiconductor layer 121 exposed through the opening 170a and the groove 120g of the mesa 120m to be electrically connected to the first conductive type semiconductor layer 121 in the region thereof. Further, the insulation layer 170 partially covers the side surface of the groove 120g to prevent occurrence of short circuit caused by contact between the first electrode extension portion 153 and the side surface of the light emitting structure 120.

In this way, the first electrode pad 151 does not directly contact the first conductive type semiconductor layer 121 and the extension portion-contact portion 153a of the first electrode extension portion 153 contacts the first conductive type semiconductor layer 121 to form electrical connection, thereby enabling efficient current spreading in the horizontal direction upon operation of the light emitting device. In a structure wherein the first electrode 150 is an n-type electrode, electrons are injected from the first electrode 150. Here, in a structure wherein the entirety of the first electrode extension portion 153 contacts the first conductive type semiconductor layer 121, electron density supplied to the first conductive type semiconductor layer 121 can vary depending upon a distance from the first electrode pad 151. In this case, current spreading efficiency can be deteriorated. Conversely, according to this exemplary embodiment, the first electrode extension portion 153 contacts the first conductive type semiconductor layer 121 through the extension portion-contact portion 153a thereof and other portions of the first electrode extension portion 153 are insulated from the first conductive type semiconductor layer 121 by the insulation layer 170. Accordingly, electrons are injected into the light emitting device through the extension portion-contact portion 153a, whereby electron injection density can be generally kept similar in a plurality of extension portion-contact portions 153a. Accordingly, electrons can be efficiently injected into the light emitting device through a portion of the first electrode extension portion 153 relatively far apart from the first electrode pad 151, thereby improving current spreading efficiency of the light emitting device.

Referring to FIG. 1B, a width of a contact portion between the extension portion-contact portion 153a of the first electrode extension portion 153 and the first conductive type semiconductor layer 121, that is, a width D1 of the opening 170a of the insulation layer 170, may be smaller than a distance D2 between the openings 170a of the insulation layer 170. Furthermore, the distance D2 between the openings 170a may be adjusted so as to be three or more times the width D1 of the opening 170a, thereby further improving performance of spreading electric current supplied through the extension portion-contact portion 153a.

Further, a distal end 153e of the first electrode extension portion 153 may include a portion, the width of which is greater than an average width of the first electrode extension portion 153. For example, as shown in FIG. 9A, the distal end 153e of the first electrode extension portion 153 may be formed in a circular shape, the diameter of which is greater than the width of the first electrode extension portion 153. In this exemplary embodiment, the diameter of the distal end 153e may be greater than the width of the first electrode extension portion 153 by about 0.5 µm to about 5 µm. However, it should be understood that other implementations are also possible and that the shape of the distal end 153e of the first electrode extension portion 153 may be modified into various shapes including a polygonal shape, an oval shape, or a circular arc shape, and the like.

With the structure wherein the distal end 153e of the first electrode extension portion 153 has a relatively large width, it is possible to improve current spreading around the distal end 153e of the first electrode extension portion 153. Further, the distal end 153e of the first electrode extension portion 153 has an enlarged area, thereby effectively preventing failure of the light emitting device due to separation of the first electrode extension portion 153 near the distal end 153e of the first electrode extension portion 153. Since the first electrode 150 is generally formed through photolithography, there has been a problem in that development can be inefficiently performed around the distal end 153e of the first electrode 150. However, in the structure wherein the distal end 153e of the first electrode extension portion 153 has a relatively large area, a process margin can be further provided upon photolithography, thereby preventing failure in the process of forming the first electrode 150. As a result, the light emitting device can have further improved reliability.

On the other hand, the arrangement of the first electrode 150 and the second electrode 160 is not limited thereto and may be modified and changed in various ways depending upon the shape of the light emitting device. The arrangement of the first electrode pad 151 and the first electrode extension portion 153 may be changed depending upon the arrangement of the second electrode pad 161 and the second electrode extension portion 163.

For example, referring to FIG. 1B, a distance A1 from the first electrode extension portion 153 extending along the second side surface 102 of the light emitting device to the second electrode extension portion 163 is greater than a distance A2 from the distal end 163e of the second electrode extension portion 163 to the first electrode pad 151. The second electrode extension portion 163 extends towards the first electrode pad 151 while maintaining a constant distance from the second electrode extension portion 163 to the first electrode extension portion 153 extending along the second side surface 102, thereby improving current spreading efficiency. In addition, the distance A2 is set to be less than the distance A1, whereby current density near the distal end of the second electrode extension portion 163 is reduced, thereby preventing deterioration in current spreading efficiency.

Furthermore, a distance A3 from the distal end 163e of the second electrode extension portion 163 to the outer periphery of the transparent electrode 140 (the periphery along the fourth side surface 104) may be substantially the same as a distance from the side surface of the second electrode pad 161 to the outer periphery of the transparent electrode 140 (the periphery along the fourth side surface 104). Here, the distance A3 may be about 50 µm to 60 µm.

Furthermore, the second electrode extension portion 163 may be biased to the fourth side 104 of the light emitting device rather than the second side surface 102 thereof. As shown in the drawings, the second electrode extension portion 163 is closer to the fourth side 104 of the light emitting device than the second side surface 102 and may be separated from a longitudinal central line CL passing through the center of the light emitting device by a distance A4. The distance A4 may range from about 14 µm to 18 µm. Since the first electrode extension portion 153 is disposed near the second side surface 102, the second electrode extension portion 163 may be disposed closer to the fourth side surface 104 than the second side surface 102 in order to improve current spreading.

FIG. 10 is a sectional view of a light emitting device according to another exemplary embodiment of the present disclosure. The light emitting device shown in FIG. 10 is generally similar to the light emitting device described with reference to FIG. 1A to FIG. 9B except that the light emitting device according to this exemplary embodiment further includes a reflective layer 510 disposed below the light emitting structure 120. The following description will focus on the different features of the light emitting device according to this exemplary embodiment, and detailed descriptions of the same components will be omitted.

Referring to FIG. 10, the light emitting device includes a light emitting structure 120, a current blocking layer 130, a transparent electrode 140, a first electrode 150, a second electrode 160, and a reflective layer 510. In addition, the light emitting device may further include a substrate 110 and an insulation layer 170. The light emitting device may include first to fourth side surfaces 101, 102, 103, 104.

The reflective layer 510 may be disposed below the light emitting structure 120, and in the structure wherein the light emitting device further includes the substrate 110, the reflective layer may be disposed under the substrate 110. The reflective layer 510 may be formed of a light reflective material to reflect light emitted from the light emitting structure 120.

The reflective layer 510 may include a distributed Bragg reflector in which dielectric layers having different indices of reflection are stacked one above another. In this exemplary embodiment, the reflective layer 510 may include a stack structure 511 in which a first dielectric layer having a first index of refraction and a second dielectric layer having a second index of refraction are repeatedly stacked one above another, and an interface layer 513 formed on an upper surface of the stack structure 511. The interface layer 513 can serves as a bonding layer on which the stack structure 511 can be formed, while improving interfacial characteristics of the first and second dielectric layers of the stack structure 511. Accordingly, the interface layer 513 may be formed to have a thicker thickness than each of the dielectric layers of the stack structure 511.

For example, the first dielectric layer may include $TiO_2$ or may be formed of $TiO_2$, and the second dielectric layer may include $SiO_2$ or may be formed of $SiO_2$. Further, the interface layer 513 may include $SiO_2$ or may be formed of $SiO_2$. In this structure, among the layers of the stack structure 511, a dielectric layer adjoining the interface layer 513 may be the first dielectric layer. Accordingly, when the entirety of the reflective layer 510 is taken into account, the reflective layer 510 may have a stack structure of different material layers. However, it should be understood that other implementations are also possible.

In the structure wherein the reflective layer 510 is disposed under the substrate 110, a lower surface of the substrate 110 may have an RMS roughness of 100 nm or less. This structure can be obtained through a surface planarization process known in the art. For example, the RMS roughness of the lower surface of the substrate 110 may be controlled by chemical mechanical polishing (CMP). As the lower surface of the substrate 110 has an RMS roughness of 100 nm or less, it is possible to prevent deterioration in bonding strength or generation of cracks on the reflective layer 510 caused by unbalance of the first dielectric layer or the second dielectric layer caused by the substrate 110 having high surface roughness upon heat treatment at high temperature.

The reflective layer 510 may further include a layer formed of a light reflective metal, or may be formed of the light reflective metal instead of the stack structure 511. Here, the layer formed of the light reflective metal may be composed of a single layer or multiple layers, and may include Al, Au, or Pt, and the like.

Figure 11:
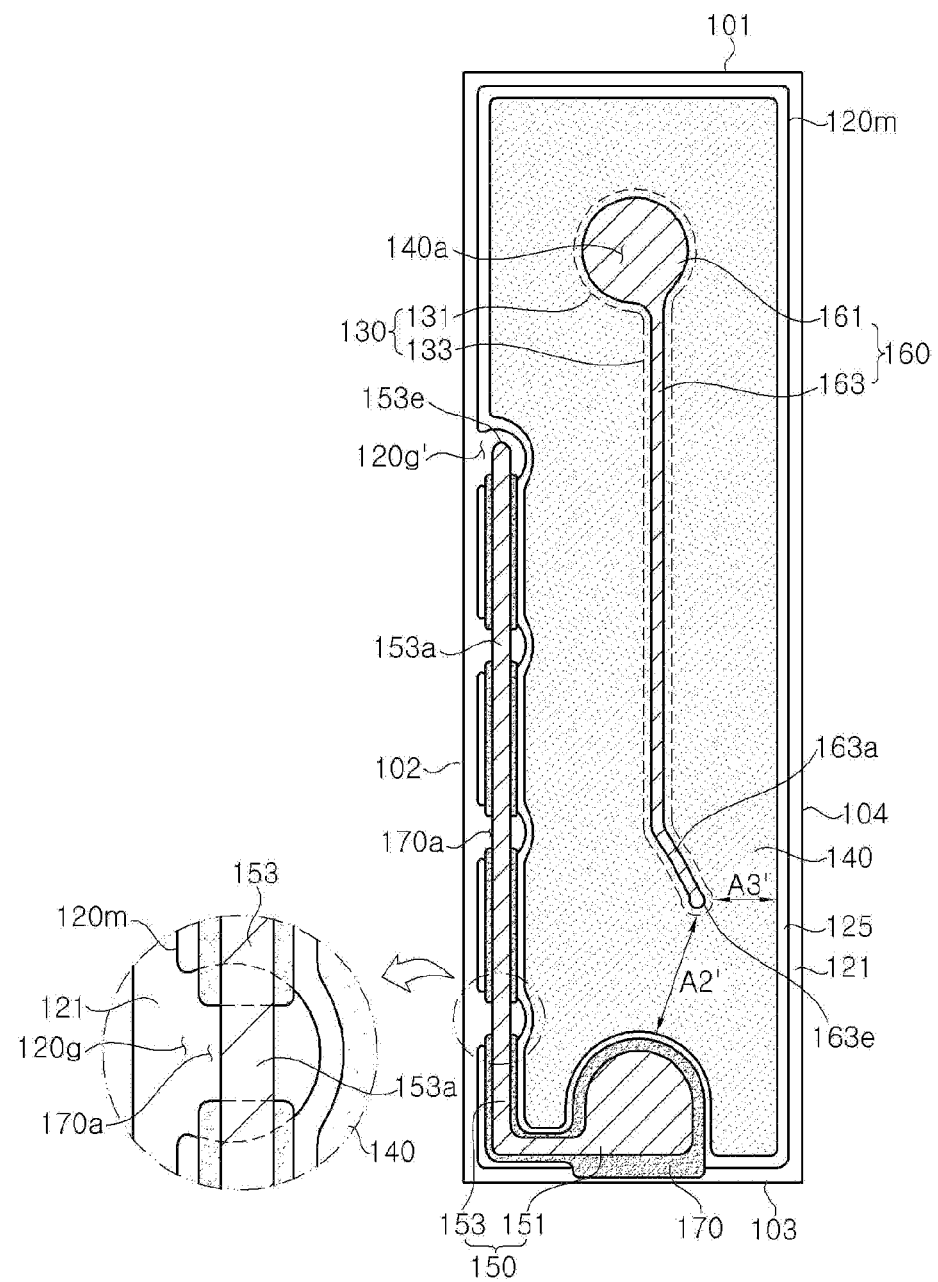
FIG. 11 is a plan view of the light emitting device according to other exemplary embodiments of the present disclosure.

FIG. 11 is a plan view of a light emitting device according to another exemplary embodiment of the present disclosure. The light emitting device shown in FIG. 11 is generally similar to the light emitting device described with reference to FIG. 1A to FIG. 9B. The following description will focus on the different features of the light emitting device according to this exemplary embodiment, and detailed descriptions of the same components will be omitted.

The light emitting device according to this exemplary embodiment includes a light emitting structure 120, a current blocking layer 130, a transparent electrode 140, a first electrode 150, and a second electrode 160. In addition, the light emitting device may further include a substrate 110, an insulation layer 170, and a reflective layer 510. The light emitting device may include first to fourth side surfaces 101, 102, 103, 104. The light emitting device may have a rectangular shape having different longitudinal and transversal lengths, without being limited thereto.

According to this exemplary embodiment, the light emitting device includes a mesa 120m including a groove 120g' having a circular arc shape in a plan view. The groove 120g' is more depressed from the side surface of the mesa 120m than the groove 120g shown in FIG. 1 A. Accordingly, the distance from the extension portion-contact portion 153a to the transparent electrode 140 may be greater than that of the light emitting device shown in FIG. 1A to FIG. 9 B. Accordingly, the light emitting device according to this exemplary embodiment can effectively prevent short circuit which can occur near the extension portion-contact portion 153a. Further, the width of a contact portion between the extension portion-contact portion 153a and the first conductive type semiconductor layer 121 may be greater than that of the light emitting device shown in FIG. 1A to FIG. 9B.

Furthermore, a distance A2' from the distal end 163e of the second electrode extension portion 163 to the first electrode pad 151 may be greater than that of the light emitting device shown in FIG. 1A to FIG. 9B, and a distance A3' from the distal end 163e of the second electrode extension portion 163 to the outer periphery of the transparent electrode 140 (the periphery along the fourth side surface 104) may be smaller than that of the light emitting device shown in FIG. 1A to FIG. 9B. Referring to FIG. 11, the distance A3' is smaller than the distance A2' but other implementations are also possible.

That is, as in this exemplary embodiment, the shape and size of the groove 120g' of the mesa 120m, and the arrangement of the first and second electrodes 150, 160 may be modified so as to further improve current spreading efficiency depending upon drive current of the light emitting device.

Figure 12:
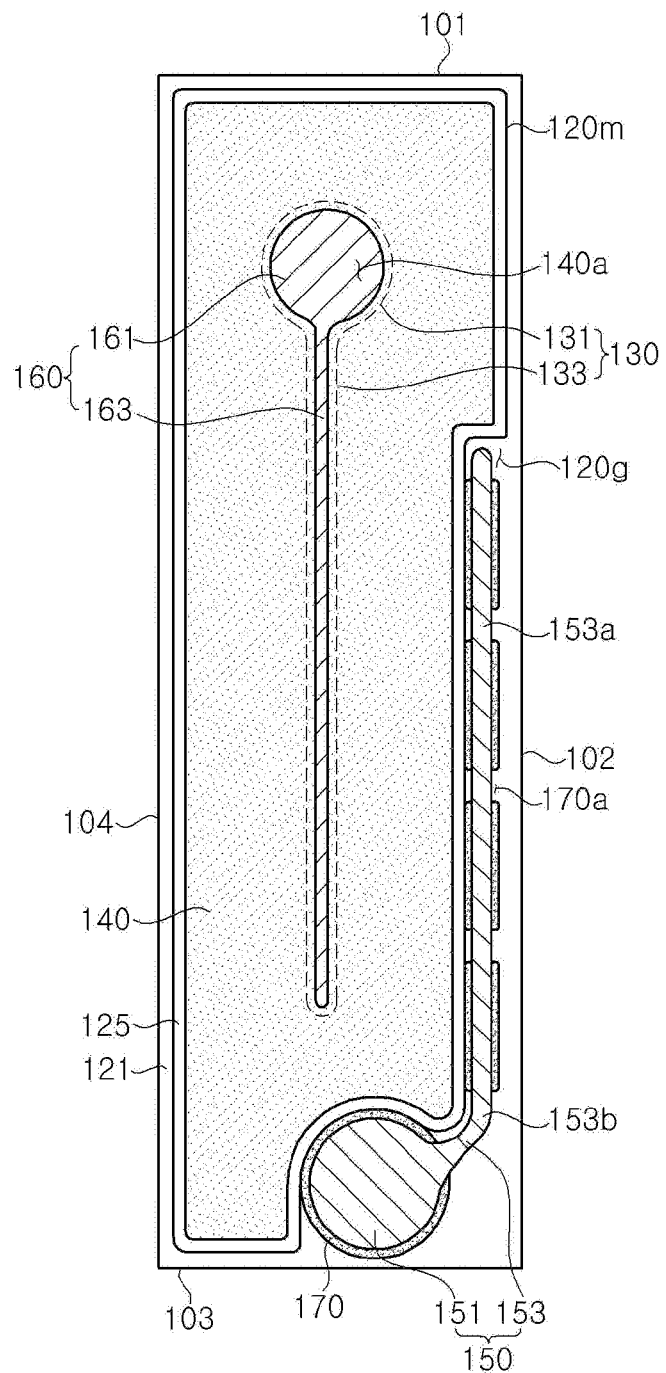
FIG. 12 is a plan view of a light emitting device according to other exemplary embodiments of the present disclosure.

FIG. 12 is a plan view of a light emitting device according to other exemplary embodiments of the present disclosure. The second electrode extension portion 163 and the first electrode extension portion 153 may have same or different width from each other. The center of the first electrode pad 151 is disposed closer to a right edge of the light emitting device than that of the second electrode pad 161. The light emitting device shown in FIG. 12 is generally similar to the light emitting device described with reference to FIG. 1A to FIG. 9B. The following description will focus on the different features of the light emitting device according to this exemplary embodiment, and detailed descriptions of the same components will be omitted.

The light emitting device according to this exemplary embodiment includes a light emitting structure 120, a current blocking layer 130, a transparent electrode 140, a first electrode 150, and a second electrode 160. In addition, the light emitting device may further include a substrate 110, an insulation layer 170, and a reflective layer 510. The light emitting device may include first to fourth side surfaces 101, 102, 103, 104. The light emitting device may have a rectangular shape having different longitudinal and transversal lengths, without being limited thereto.

According to this exemplary embodiment, the first electrode 150 is disposed on the first conductive type semiconductor layer 121. That is, the first electrode 150 may be disposed adjacent to a side surface of a mesa 120m instead of being disposed on the mesa 120m. The insulation layer 170 may be partially interposed between the first electrode 150 and the first conductive type semiconductor layer 121. Further, the insulation layer 170 may include two or more openings 170a exposing part of the first conductive type semiconductor layer 121. In this exemplary embodiment, the first electrode extension portion 153 includes a first extension portion-contact portion 153a and a second extension portion-contact portion 153b. The first the extension portion-contact portion 153a may contact the first conductive type semiconductor layer 121 through the openings 170a formed along a long side surface of the mesa 120m. The second extension portion-contact portion 153b may be disposed adjacent to the first electrode pad 151 and may form ohmic contact with the first conductive type semiconductor layer 121 exposed to the side surface of the mesa 120m. In this exemplary embodiment, the second extension portion-contact portion 153b may be disposed near a corner of the mesa 120m. As such, in addition to the first the extension portion-contact portion 153a, the second extension portion-contact portion 153b is formed to contact the first conductive type semiconductor layer 121, thereby further improving current spreading in a region near the first electrode pad 151.

Figure 13:
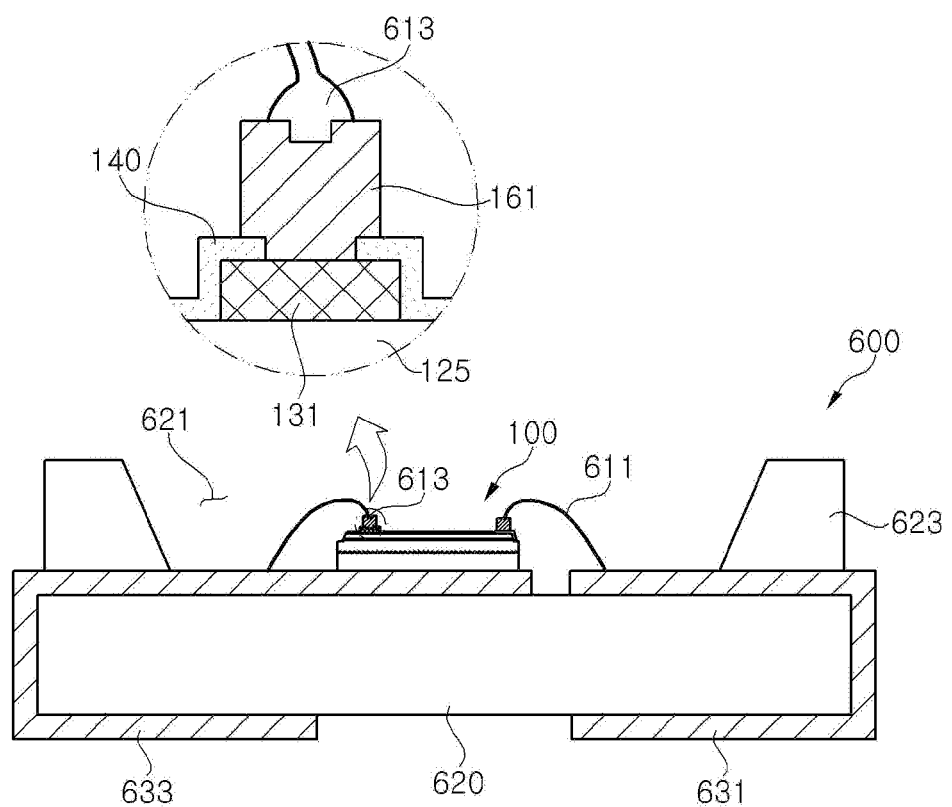
FIG. 13 is a sectional view of a light emitting device package according to other exemplary embodiments of the present disclosure.

FIG. 13 is a sectional view of a light emitting device package according to other exemplary embodiments of the present disclosure.

Referring to FIG. 13, a light emitting device package 600 includes a light emitting device 100, a first lead 631 and a second lead 633 electrically connected to the light emitting device 100, and wires 611, 613. In addition, the light emitting device package 600 may further include a base 620 and a reflector 623.

The light emitting device 100 may be mounted on the base 620, particularly, on the second lead 633 or the first lead 631. In this exemplary embodiment, the light emitting device 100 may be surrounded by the reflector 623 formed along a side surface of the base 620, and the reflector 623 has an inclined surface to reflect light, thereby improving luminous efficacy of the light emitting device package.

The light emitting device 100 may be one of the light emitting devices according to the exemplary embodiments described with reference to FIG. 1A to FIG. 12 or a light emitting device obtained through modification thereof. As described above, the second electrode pad 161 of the light emitting device 100 has a non-flat surface profile, and for example, includes a depression 161g corresponding to the opening 140a. The second electrode pad 161 is electrically connected to the second lead 633 through the second wire 613.

In this exemplary embodiment, the second wire 613 may be electrically connected to the second electrode pad 161 through ball bonding. As shown in FIG. 13, upon ball bonding of the second wire 613 to the second electrode pad 161, the second wire 613 can be stably bonded to the second electrode pad 161 by the depression 161g formed on the surface of the second electrode pad 161. Accordingly, it is possible to improve reliability of the light emitting device package by preventing wire contact failure upon packaging of the light emitting device while preventing disconnection of wires caused by internal/external factors even after manufacture of the light emitting device package.

Furthermore, the light emitting device has good current spreading efficiency, thereby securing good efficiency even under high current driving conditions. Accordingly, the light emitting device package including the light emitting device can also be used for high current driving applications.

Although some exemplary embodiments have been described above, it should be understood that these embodiments are given by way of illustration only, and that various modifications, variations, and alterations can be made without departing from the spirit and scope of the present disclosure.

The invention claimed is:

1. A light emitting device comprising:
    a first conductive type semiconductor layer;
    a mesa disposed on the first conductive type semiconductor layer and comprising an active layer and a second conductive type semiconductor layer disposed on the active layer;
    a current blocking layer partially disposed on the mesa;
    a transparent electrode disposed on the mesa and at least partially covering the current blocking layer;
    a first electrode insulated from the second conductive type semiconductor layer, and comprising a first electrode pad and a first electrode extension portion extending from the first electrode pad;
    a second electrode disposed on the current blocking layer to be electrically connected to the transparent electrode, and comprising a second electrode pad and a second electrode extension portion extending from the second electrode pad; and
    an insulation layer partially disposed in a region under the first electrode,
    wherein the current blocking layer comprises a pad-current blocking layer disposed under the second electrode pad, wherein the transparent electrode comprises a first opening disposed on the pad-current blocking layer and a second opening exposing the second conductive type semiconductor layer and disposed in the first opening, the second electrode contacting the second conductive type semiconductor layer through the second opening, and an upper surface of the second electrode comprises a first depression disposed to correspond to the first opening and a second depression disposed to correspond to the second opening.

2. The light emitting device according to claim 1, wherein the width of the distal end of the second electrode extension portion is greater than the average width of the second electrode extension portion.

3. The light emitting device according to claim 2, wherein the distal end of the second electrode extension portion has a circular shape having a diameter greater than a width of the second electrode extension portion.

4. The light emitting device according to claim 1, wherein the second electrode extension portion comprises an additional extension portion extending from the second electrode extension portion such that the additional extension portion is further away from the first electrode extension portion than the second electrode extension portion is.

5. The light emitting device according to claim 4, wherein the additional extension portion is formed in a curved shape having a predetermined curvature.

6. The light emitting device according to claim 4, wherein the additional extension portion is bent towards one corner of the light emitting device.

7. The light emitting device according to claim 1, wherein the first electrode pad and the second electrode pad are disposed on a longitudinal line passing through a center of the light emitting structure; the first electrode pad is disposed adjacent to a third side surface of the light emitting device; and the second electrode pad is disposed adjacent to a first side surface of the light emitting device opposite to the third side surface thereof.

8. The light emitting device according to claim 7, wherein the first electrode extension portion extends towards the first side surface along a second side surface of the light emitting device connecting the first side surface and the third side surface of the light emitting device; and the second electrode extension portion is disposed closer to a fourth side surface of the light emitting device opposite to the second side surface than the second side surface of the light emitting device and extends towards the third side surface of the light emitting device.

9. The light emitting device according to claim 8, wherein the shortest distance from the second electrode pad to the fourth side surface of the light emitting device is the same as the shortest distance from the distal end of the second electrode extension portion to the fourth side surface of the light emitting device.

10. The light emitting device according to claim 7, wherein the opening of the insulation layer comprises a plurality of openings arranged at constant intervals along the second side surface.

11. The light emitting device according to claim 1, wherein the shortest distance from the first electrode extension portion to the second electrode extension portion is greater than a distance from the distal end of the second electrode extension portion to the first electrode pad.

12. The light emitting device according to claim 1, wherein a distance between the openings of the insulation layer is three or more times a width of the opening of the insulation layers exposing the groove.

13. The light emitting device according to claim 1, wherein the current blocking layer comprises an extension portion-current blocking layer disposed under the second electrode extension portion.

14. The light emitting device according to claim 13, wherein the second electrode pad is disposed on the pad-current blocking layer to fill the first opening while partially covering the transparent electrode disposed on the pad-current blocking layer; and an upper surface of the second electrode pad has a surface profile corresponding to an upper surface of the pad-current blocking layer and an upper surface of the transparent electrode disposed on the current blocking layer.

15. The light emitting device according to claim 1, wherein the pad-current blocking layer comprises a first region surrounded by the second opening and a second region surrounding the second opening; and an upper surface of the second electrode comprises a protrusion protruding from a lower surface of the second depression and disposed in the first region of the pad-current blocking layer.

16. The light emitting device according to claim 1, wherein the insulation layer is disposed on the mesa; the mesa comprises at least one groove formed on a side surface of the mesa such that the first conductive type semiconductor layer is partially exposed through the groove; and the opening of the insulation layer at least partially exposes the first conductive type semiconductor layer exposed through the groove.

17. The light emitting device according to claim 16, wherein the first electrode pad and the first electrode extension portion are disposed on the mesa, and the extension portion-contact portion forms ohmic contact with the first conductive type semiconductor layer exposed through the groove.

18. The light emitting device according to claim 1, wherein the insulation layer is disposed on the first conductive type semiconductor layer; and the extension portion-contact portion comprises a first extension portion-contact portion and a second extension portion-contact portion,
the first extension portion-contact portion being disposed along one side surface of the mesa,
the second extension portion-contact portion being disposed near one corner of the mesa so as to be adjacent to the first electrode pad.

19. The light emitting device according to claim 1, wherein the substrate comprises a plurality of modification regions formed on at least one side surface of the substrate and having a strap shape extending in a horizontal direction of the substrate, and a distance between a lowermost modification region and a lower surface of the substrate is smaller than a distance between an uppermost modification region and an upper surface of the substrate.

* * * * *